Oct. 25, 1960 R. C. SWENGEL 2,958,064

CIRCUIT BOARD AND SOCKET CONSTRUCTION

Filed Nov. 26, 1957

INVENTOR.
Robert C. Swengel

BY

Curtis, Morris + Safford
ATTORNEYS

United States Patent Office 2,958,064
Patented Oct. 25, 1960

2,958,064

CIRCUIT BOARD AND SOCKET CONSTRUCTION

Robert C. Swengel, Hellam, Pa., assignor to AMP Incorporated, Harrisburg, Pa.

Filed Nov. 26, 1957, Ser. No. 698,990

6 Claims. (Cl. 339—17)

This invention relates to improvements in a circuit board and, more particularly, a circuit board having thin metallic ribbons or strips of circuit members provided thereon and commonly referred to as printed circuit boards.

At present, circuit boards of the type referred to commonly are formed from synthetic resin, either of the thermosetting or thermoplastic types. They are sufficiently rigid to be suitable for use as a circuit board but such material has a poor elastic memory and tends to creep over a period of time. This is highly unsatisfactory, especially if a socket opening is formed therein for purposes of receiving prong-like members of an electrical component, such as conventional leads projecting from said components, which are to be connected in circuit with the circuit ribbons or strips upon the circuit board. If such prong-like member is inserted tightly initially into the socket, the poor elastic memory and tendency of the resin to creep causes the walls of the socket to expand and thereby destroy the tight grip on the prong-like member inserted therein. As a result of this, it is common practice at present to connect leads or other prong-like members of electrical components to the circuits of circuit boards by effecting a soldered connection therebetween.

Although soldered connections of this type are highly effective to establish firm circuit connections between the circuit members and the electrical components, such soldering increases the cost of fabrication of a completed circuit board with components. Further, and more importantly, circuit boards of this type are serviced by personnel who do not always use the required care to preserve the necessary characteristics and intended functions of the board and the somewhat delicate circuit means thereon. For example, when it becomes necessary to repair the circuit, such as by replacing any of the components for example, such connections must be unsoldered, usually by means of a soldering iron or flame. In view of the close proximity of many of the sockets to each other on a circuit board of this type, the heating of one connection to unsolder the same frequently results in unsoldering the connections of other adjacent sockets. Further, such unsoldering and re-soldering operations in addition to being time consuming and difficult to perform, not infrequently result in the bond between the circuit strips or ribbons and the board being altered or destroyed, and the delicate circuit members also sometimes are ruptured.

For various reasons, it has not been possible heretofore to provide socket constructions in circuit boards of this type into which a prong or lead, for example, of an electrical component can be inserted to effect connections thereof with the circuit on the board simply by frictionally inserting such prong or lead into the socket so as to engage the circuit means within the socket, without soldering. The relatively rigid nature of the synthetic resins from which such circuit boards are commonly made probably is one reason for discouraging development of this type of connection, as well as the poor elastic memory and tendency thereof to creep, as referred to above.

It is the principal object of the present invention to provide a circuit panel board having a socket construction which will permit the reception of a prong-like member of an electrical component therein for connection with a circuit upon the board simply by projecting the member into such socket which originally is of smaller cross-sectional dimension than that of the member. A tight contact between the circuit means within the socket and the member inserted thereinto is established by the elastic nature of the material from which the panel board is made so as to permit overall diametral expansion of the socket walls.

Another object of the invention is to provide rigid supporting means for the elastic board and associated therewith by simple means, the relationship between the elastic board and rigid supporting means being capable of several embodiments of arrangement, thereby affording a plurality of means for supporting circuit members thereupon or therebetween, all of these embodiments being capable of simple fabrication resulting in permanent constructions suitable for long and continuously effective life to provide firm connections between the circuit of the board and the prong-like members of electrical components connected thereto by insertion of said members into the sockets of the board.

A further object of the invention is to produce a circuit board of a laminated construction comprising two or more layers of preferably synthetic resin or other comparable insulating material, the respective layers being of different characteristics and one of said layers being considerably more elastic than the others which are relatively rigid to afford satisfactory supporting means for the elastic layer. All of said layers preferably are bonded by simple and effective means into a composite structure provided with socket openings having the desired characteristics described above and said layers also afford highly effective means for supporting the circuit members for the board which may be applied thereto in any one of a number of satisfactory methods to render the circuit board capable of long life and continuous use.

Still another object of the invention is to provide circuit means within the sockets of the board which provide a maximum of metallic contact with the prong-like members of electrical components inserted within said sockets, the construction of the circuit means within the sockets being such as to permit ready expansion thereof simultaneously with the walls of the socket when a prong-like member of greater cross-sectional dimension than the socket is inserted thereinto for purposes of establishing firm mechanical and electrical contact between said member and the walls of the socket, including the metallic circuit means formed within the socket.

Details of the foregoing objects and of the invention, as well as other objects thereof, are set forth in the following specification and are illustrated in the accompanying drawing comprising a part thereof.

In the drawing:

Figure 1 comprises two vertical sectional views of a laminated circuit board made in accordance with the principles of the present invention, view A illustrating a fragmentary portion of one embodiment of circuit board shown in the process of having a prong-like member of an electrical component inserted into the socket illustrated in said view, while in view B, the member is illustrated in completely inserted position within said socket.

Figures 1A, 1B, 2A, 2B, 3A, 3B, 4A, 4B, 5A, 5B, 6, 7, 8, 9, 10A, 10B:
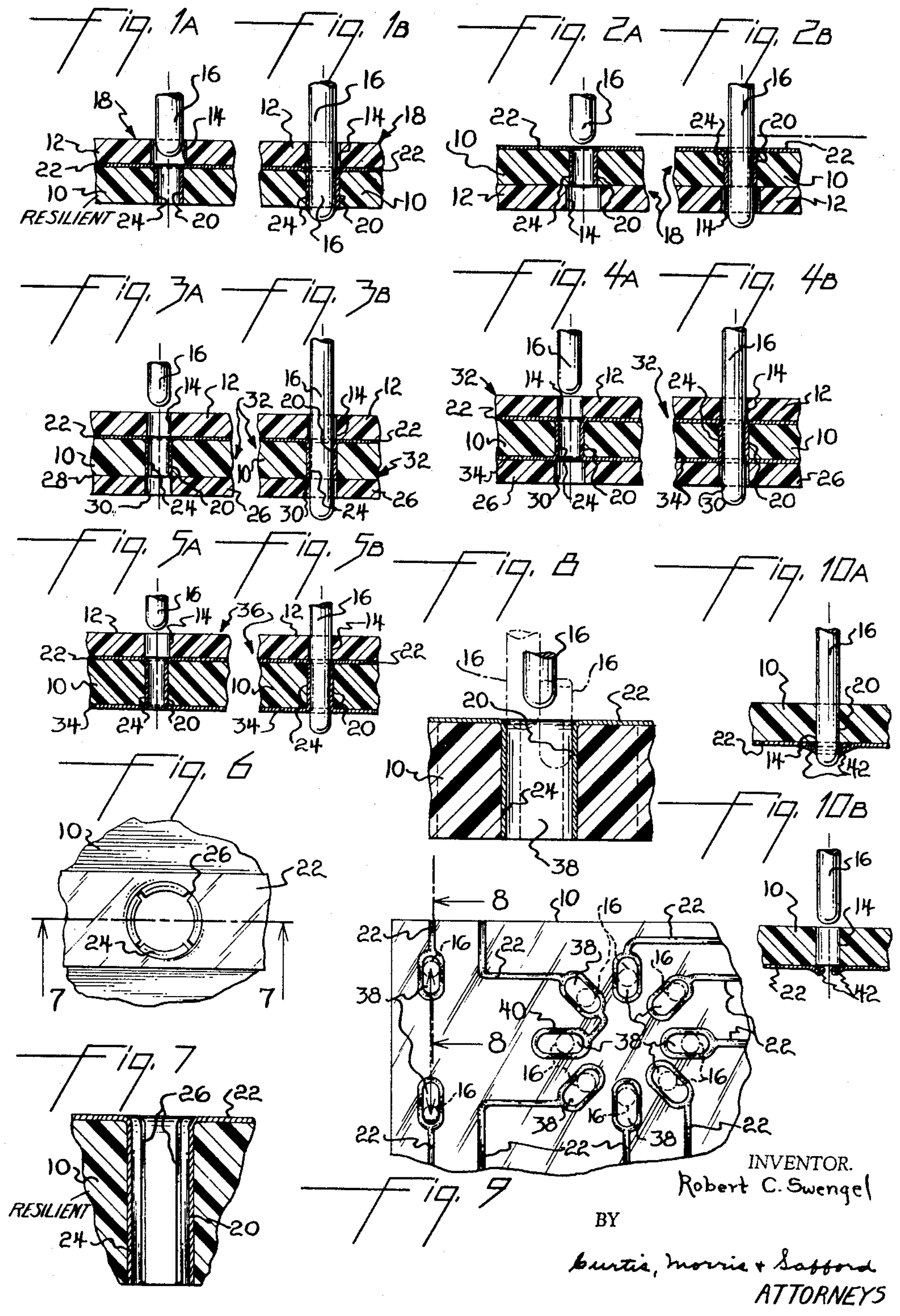
Figure 2 is an illustration similar to Figure 1 but showing another embodiment of laminated circuit board embodying the principles of the present invention and the views A and B illustrated therein respectively show the prong-like member about to be inserted in the socket and completely received within said socket.
Figure 3 is an illustration similar to Figures 1 and 2 but showing a still further embodiment of the invention, the two views shown in Figure 3 respectively illustrating a prong-like member about to be inserted within the socket shown in view A, while in view B, the member is illustrated as fully inserted within said socket.
Figure 4 is an illustration similar to Figures 1 through 3 but showing a still further embodiment of laminated circuit board embodying the principles of the present invention and including views A and B to illustrate respectively the prong-like member of an electrical component about to be inserted within the socket and fully inserted thereinto.

Figure 5 also is an illustration similar to Figures 1 through 4 but showing still another embodiment of laminated circuit board, the same being illustrated in views A and B respectively showing a prong-like member about to be inserted within the socket and fully inserted thereinto.

Figure 6 is a fragmentary top plan view of a portion of a circuit board made in accordance with any of the embodiments illustrated in the preceding figures and showing particularly an exemplary embodiment of metallic circuit member and an extension thereof which lines the walls of a socket formed in the board and is capable of expansion therewith.

Figure 7 is a fragmentary vertical sectional view of the socket and circuit construction shown in Figure 6 as seen on the line 7—7 of said figure.

Figure 8 is a fragmentary vertical sectional view showing a further embodiment of shape of socket opening formed in an exemplary circuit board embodying the principles of the present invention as seen on the line 8—8 of Figure 9.

Figure 9 is a top plan view of a fragmentary portion of a circuit board illustrating a plurality of sockets formed therein, said sockets being elongated and of the type shown in sectional view in Figure 8 and this view also illustrating an exemplary arrangement of circuit means formed upon the board and associated with said sockets.

Figure 10 is a view similar to Figures 1 through 5 and showing one further embodiment of circuit board construction having circuit means formed thereon in an exemplary manner, this illustration also including views A and B respectively showing a prong-like member of an electrical component about to be inserted into the socket and completely inserted therein so as to be connected with the circuit means of the board.

Circuit board constructions of the type envisioned by the present invention are susceptible of a number of different embodiments, certain exemplary illustrations of which are included in the drawings of this application. In most of these exemplary embodiments, a board formed from flexible material is included and is combined with one or more boards formed from relatively rigid material. All of these materials preferably are of an electrical insulation nature, the purpose of the flexible material being to provide a medium within which a socket opening may be formed of smaller cross-sectional dimension than that of a prong-like member such as the lead of an electrical component to be received within said socket tightly. Hence, the principal property desired in such material is that it be flexible and yieldable so as to permit the walls of the socket to expand to receive such prong-like member, and yet the material is of a somewhat rubbery nature so as to be self-contracting when expanded, thereby gripping said prong-like member tightly.

In order to afford examples of suitable resilient materials of an insulating nature which are useful to accomplish this purpose, the following are set forth without intention that the enumerated materials shall be restrictive inasmuch as other materials having properties common to the recited ones may be used:

Rubber base phenolic compounds
Synthetic rubber
Polyethylene terephthalate (Mylar)
Polymonochlorotrifluoroethylene (Kel-F)
Polyamide resins (nylon)
Reaction product of hexamethylene-diamine and adipic acid (Zytel)
Acrylic resins
Polymers or copolymers of polyethylene The relatively rigid board or sheet-like member which is associated with the flexible board or sheet may be formed from a number of suitable substances, of which the following are exemplary:

Phenolic base resins
Hard Fiber
Melamine resins
Epoxy resins

While it is conceivable that a circuit board of the so-called printed circuit type may be formed to embody the present invention solely from one of the resilient materials, or the equivalent thereof, set forth above, it is preferred that a laminated board structure be provided such as one of the types illustrated in exemplary manner in Figures 1 through 5, wherein at least one layer or sheet 10 of resilient and rubbery-type material be bonded or otherwise suitably affixed to a reinforcing layer or sheet 12 formed from rigid material such as one of those included in the second list set forth above, or the equivalent thereof, whereby the laminated product is provided with adequate supporting rigidity for the board, yet the benefits of the resilient layer 10 may be used as described hereinafter.

Referring to Figure 1, it will be seen that views A and B are shown, view A illustrating the rigid layer 12 provided with a socket aperture 14 preferably of slightly greater diameter or cross-sectional dimension than that of a prong-like member 16, such as the lead of an electrical component, which is to be supported by the laminated board 18. The resilient layer 10 is provided with a socket aperture 20 having a smaller diameter or cross-sectional dimension than that of the member 16.

Associated with the laminated board 18 in any one of a number of different arrangements illustrated respectively in Figures 1 through 10 is an exemplary circuit member 22 which, as shown in Figure 6 for example, is thin and ribbon-like in form, the same being formed either by punching the circuit pattern from metal foil such as copper, and affixing it by resinous cement or the like to one or the other of the layers 10 and 12, or both, said layers or laminae also preferably being bonded together by similarly functioning cement or adhesive.

A circuit extension 24, preferably integral with the circuit member 22, projects into the socket aperture 20 at least partially and is fixed to the walls of socket 20 by cement or otherwise. Preferably, the metal from which the circuit extension 24 is formed is resilient and the extension preferably is formed in the nature of a socket, one exemplary construction of which is illustrated in Figures 6 and 7, wherein circuit extension 24 is tubular and may be formed by drawing or swaging prior to insertion into socket aperture 20 and then bonded to the walls of the socket in any suitable manner. Extension 24 also may be joined by electro-deposition. In order to render the extension or lining 24 of the circuit means within socket 20 expansible, Figures 6 and 7 illustrate one exemplary means to accomplish this such as a plurality of circumferentially spaced and axially extending slits 26. Hence, when the prong-like member 16 is inserted through socket aperture 14 and into socket aperture 20 containing the circuit extension 24, said extension may expand due to the fact that it is initially of smaller cross-sectional dimension than that of member 16, the expansion of extension 24 also causing expansion of the walls of socket aperture 20. The flexible and rubbery nature of the layer 10 is such that it will constantly urge the circuit extension 24 into firm physical and electrical engagement with prong-like member 16 when said member is fully inserted into the composite socket as shown in view B of Figure 1.

Due to the fact that the circuit extension 24 is bonded to the walls of the socket aperture 20 of layer 10, the member 16 readily may be withdraw from said socket when desired, such as for purposes of replacement or repair, simply by pulling the member 16 axially from said socket. This may be accomplished easily without the use of tools, heat or any of the conventional means now required relative to soldered connections now commonly used.

As thus constructed, rigid layer 12 by virtue of aperture 14, being only of slightly greater diameter than lead member 16 closely limits the movement transverse to its axis of lead member 16 adjacent resilient layer 10. Accordingly overstressing of layer 10 tending to impair its grip on the lead member is precluded. Moreover, rigid layer 12 provides an area of support surrounding that portion of flexible layer 10 which is under stress thereby acting to reduce the rate of plastic creep.

In the embodiment shown in Figure 2, the circuit arrangement is different from that shown in Figure 1 in that the circuit member 22 is uppermost and is affixed by cement or the like to the upper surface of resilient layer or lamina 10 while the rigid layer or lamina 12 is fixed to the surface of flexible layer 10 opposite that to which the circuit member 22 is affixed. It will be understood that the circuit member 22 is bonded or otherwise secured to the upper surface of flexible layer or sheet 10 and the socket aperture 20 therein is smaller in cross-sectional dimension than the prong-like member 16, while the socket aperture 14 in rigid layer 12 is larger cross-sectionally than member 16, whereby upon insertion of the member 16 into socket aperture 20, the walls thereof and the circuit extension 24 therein will expand so as to receive the member 16 as shown in view B of Figure 2 tightly. When the member 16 is inserted into the socket aperture 20, it will tend to force some of the flexible material of layer 10 down into the socket aperture 14 of rigid layer 12, whereby the walls of the aperture 14 will tend somewhat to function as constricting means for the walls of aperture 20 of resilient layer 10, thereby insuring firm gripping of the member 16 by the circuit extension 24 over long periods of time. Nevertheless, the member 16 may be removed by pulling the same axially from the socket in a direction extending away from the circuit member 22 of the laminated board 18.

The construction shown in Figure 3, basically, is similar to that shown in Figure 1 excepting that a second outer layer or lamina of rigid material 26 is fixed by a layer of cement 28 or other suitable adhesive to the lower surface of the resilient layer 10. Said second rigid sheet or layer 26 also is provided with a socket aperture 30 of a diameter similar to that of aperture 14 in upper rigid layer 12, while the socket aperture 20 in flexible layer 10 is smaller in cross-sectional dimension than that of member 16 as in regard to Figure 1. The circuit extension 24 at least partially extends into socket aperture 20 or completely lines the same as shown in exemplary manner in views A and B of Figure 3.

When the member 16 of view A in Figure 3 is fully inserted into the composite socket therefor in the laminated board 32 of Figure 3, the walls of socket aperture 20 and circuit extension 24 will be expanded to receive the member and will tightly engage the same. Further, the adherence of the opposite surfaces of flexible layer 10 respectively to the inner surfaces of rigid layers 12 and

26 will result in stabilizing particularly the portion of material of resilient layer 10 immediately adjacent the socket aperture 20, thereby enhancing the tight fit inherently resulting from the flexible nature of material from which layer 10 is formed.

Figure 4 illustrates a slightly different embodiment from that shown in Figure 3, particularly in regard to the circuit means; otherwise the laminated board 32 of Figure 4 being similar to that of the board 32 of Figure 3. It will be seen from both views A and B of Figure 4 that additional circuit members 34 are disposed between resilient layer 10 and the lower rigid layer 26, such circuit members 34 preferably being cemented to one or both of the adjacent surfaces of layers 10 and 26 which engage the same so as to firmly position the circuit member therebetween. Such an arrangement affords a wider latitude of circuit design than that afforded by the embodiment illustrated in Figures 1 through 3. Preferably, the circuit extension 24 of Figure 4 is connected at its lower end to the circuit members 34, especially where a certain design of circuit requires the same.

With reference to Figure 5, it will be seen that still another arrangement of laminated circuit board and circuit arrangement is illustrated, this arrangement being similar in circuit arrangement to that of Figure 4, while in Figure 5, the laminated board does not have a lower rigid layer, whereby the laminated board structure in Figure 5 more closely resembles that of Figure 1. The arrangement of Figure 5 affords more ready access to the additional circuit member 34 due to the same being fully exposed on the lower surface of the laminated board 36.

It will be understood in regard to Figures 1 through 5 that, especially where the circuit extension 24 within the socket aperture 20 extends substantially through the entire socket aperture and particularly where the extension 24 is swaged into cylindrical form as shown in Figures 6 and 7 for example, said extension 24 preferably is provided with slits 26 or other similar means which readily permit expansion of the walls of extension 24 incident to the member 16 expanding the walls of socket aperture 20 of resilient layer 10. Further, referring to Figure 3, when the prong-like member 16 is inserted into socket aperture 20 into engagement with the circuit extension 24 therein or with which it is lined, there is a tendency to squeeze or extend a limited amount of the material from which resilient layer 10 is formed into the lower socket aperture 30 of additional layer 26 of rigid material, similarly to that which takes place in regard to the construction shown in Figure 2 and described above.

Because of the simplicity by which it may be formed, the socket apertures 14, 20 and 30 are illustrated as being cylindrical. Said socket apertures may be formed readily either by molding, drilling, stamping or punching. Also, one of the commonest cross-sectional shapes of prong-like members 16, such as the lead of an electrical component, is circular, principally because the same can be formed from wire of a desired diameter for example. However, the present invention is not intended to be restricted to the socket apertures being circular in cross-section. Under certain circumstances, it is preferable indeed to have the cross-sectional shape of a socket for such prong-like members other than circular. For example, a suitable socket aperture which is elongated may be used, having semi-cylindrical opposite ends such as the exemplary socket aperture 38 shown in Figures 8 and 9.

To simplify the illustration in these figures, only a single layer circuit board is shown, this preferably being a sheet of resilient material 10 of the type illustrated in the preceding figures. The circuit member 22 is affixed to one surface of board 10 and an extension 24 thereof is disposed within the socket aperture 38. The cross-sectional shape of the aperture 38 is shown in plan view in Figure 9, while the vertical sectional elevation thereof is shown in Figure 8, this being taken on line 8—8 of Figure 9.

The principal advantage of a transversely elongated socket 38 is that it permits a range of latitude for the position within the aperture where the prong-like member 16 is received, several exemplary positions being shown respectively in full and dotted lines in Figure 8. Hence, although the longest dimension transversely of the aperture 38 is greater than the cross-sectional dimension or diameter of prong-like member 16, the opposite transverse dimension thereof is less than that of member 16. Accordingly, the opposing side walls of socket 38 will grip opposite surfaces on prong-like member 16 firmly. By using a socket arrangement such as shown in Figures 8 and 9, it will be seen that exact locating of the sockets 38 within the circuit board 10 for example is not necessary due to the latitude afforded by the elongated nature of the socket. Further, the spacing between two or more prong-like members 16 on an electrical component for example need not be as precise as otherwise is required when using cylindrical socket apertures for example.

Referring to Figure 9, it will be seen near the left-hand end of the exemplary board 10 that a pair of the elongated apertures 38 are disposed in one arrangement of alignment with each other, particularly so as to receive respectively the leads at the opposite end of a single electrical component for example. However, in regard to the prongs on a vacuum tube for example, the circular cluster of elongated socket apertures 38 are adapted to receive this type of component and permit a desirable but limited amount of positioning ranges of the member 16 within the sockets 38. Also from this figure, it will be seen that each of the sockets 38 is outlined by a somewhat oval band denoting in exemplary manner a metallic flange 40 preferably surrounding each of the apertures 38 and comprising a projection from the upper end on the circuit extension members 24 within the sockets 38. Said flanges preferably are cemented or otherwise affixed to the upper surface of board 10 so as to hold the same in desired operative position relative to the board. Hence, a wide variety of circuit arrangements may be provided, as required by any particular design of circuit, several exemplary illustrations being suggested by Figure 9.

Referring to Figure 10, a somewhat different concept of establishing a firm electrical connection between a prong-like member 16 and a circuit member 22 fixed to the panel board 10 or 12 is illustrated. The socket 14 or 20 shown therein may, as desired, either be of greater cross-sectional dimension than the member 16, thereby corresponding to socket 14 in the preceding figure, or if the board comprises a layer 10 of resilient material in accordance with the embodiments of the invention illustrated hereinabove, the socket 20 may be of smaller cross-sectional dimension that the member 16, thereby gripping the same tightly when inserted therein as shown in view B of Figure 10. The circuit member 22, where crossing the socket aperture 14 or 20, is provided with a plurality of radially directed fingers 42, producing somewhat of a daisy pattern, the fingers 42, for example being formed by a plurality of radially extending slits intersecting the axis of the socket aperture 14 or 20. Under such circumstances, the circuit member 22 and the fingers 42 preferably are of resilient metal such as Phosphor-bronze, resilient brass, or the like.

It will be understood that the circuit member 22 is cemented or otherwise firmly affixed to the board 10 or 12. Thus, when the prong-like member 16 is inserted through the socket aperture 14 or 20, respectively shown in views A and B of Figure 10, the leading end of the member 16 will engage the tips of the radial fingers 42 of the circuit member and move the same outwardly from the plane of the circuit member 22, whereby the inherent stiffness and resilience of the fingers 42 will firmly engage member 16 and establish a desirable electrical connection therewith which will be maintained for long periods of time. However, when it is desired to remove the prong-like member 16 from engagement with the fingers 42, the smooth contour of the member 16 will permit the same to be moved slidably relative to the outer ends of fingers 42 in a direction opposite to the insertion direction of member 16 relative to socket aperture 14 or 20.

From the foregoing, it will be seen that the present invention provides a plurality of embodiments for establishing a firm mechanical and electrical connection between the prong-like member of an electrical component and circuit means within a socket formed in the circuit board which is to support the electrical component. Very simple and inexpensive ways of forming the socket apertures are illustrated in various ways in the figures of the drawing. Such illustrations embody beneficial features and aspects of the invention which are common to all of the various embodiments. Firm connection between the prong-like member and the walls of the socket in the circuit board are achieved, primarily by selecting a suitable flexible material from which at least one layer of a laminated circuit board is formed in accordance with the invention. The socket opening in the flexible layer of such a laminated board is of smaller cross sectional dimension than that of the prong-like member which is forced thereinto to establish electrical connection with the circuit means and members of the circuit board. Various embodiments are illustrated and described herein which afford a wide latitude of circuit arrangement, as well as various ways of enhancing the flexible nature of the flexible layer of the board, where laminated, and such laminates also include a rigid layer which enhances the gripping of the prong-like member by the walls of the socket, as well as providing rigid support for the flexible layer of a laminated board.

While the invention has been described and illustrated in its several preferred embodiments, and has included certain details, it should be understood that the invention is not to be limited to the precise details herein illustrated and described since the same may be carried out in other ways falling within the scope of the invention as claimed.

I claim:

1. A laminated circuit panel board comprising a rigid layer of insulating material secured to a layer formed from elastic insulating material capable of self-restoration to a shape from which it is moved, said elastic layer having a socket opening formed therein to receive a prong-like member of greater cross-sectional dimension than said socket opening and said rigid layer having a coaxial opening of greater cross-sectional dimension than said member, whereby said elastic layer permits expansion of the wall surfaces of the socket opening therein to receive said prong-like member tightly, and circuit means extending along one of said layers and having portions extending into said socket for firm contact with said member when inserted into said socket, the rigid layer of said board being operable to restrict the expansion of the walls of the socket opening in said elastic layer and thereby holding the socket walls thereof and the circuit means therein in firm contact with said member.

2. The laminated circuit board set forth in claim 1 further characterized by said rigid layer being affixed to one surface of said elastic layer and said circuit means being affixed to the opposite surface thereof, whereby when a prong-like member is inserted into the socket opening of said elastic layer from the end to which said circuit is affixed thereto a portion of said elastic layer may expand into the opening within said rigid layer, thereby affording constricting means for said socket opening in said elastic layer.

3. The laminated circuit board set forth in claim 1 wherein said extending portions of said circuit means comprise printed circuit linings on the socket sidewalls, said linings having a plurality of longitudinal splits to avoid interference with the elastic compression of the adjacent board material.

4. A composite circuit panel board comprising a layer formed from elastic insulating material capable of self-restoration to a shape from which it is moved, said board having a socket opening extending therethrough of smaller cross-sectional dimension than a prong-like member to be received therein, a rigid sheet-like layer fixed respectively to opposite surfaces of said elastic board and having openings therein coaxial with said socket opening and of greater cross-sectional dimension than said prong-like member to be inserted within said socket opening, and circuit means positioned between said elastic layer and one of said rigid layers and having portions extending into said socket opening for engagement by said prong-like member, whereby the elastic nature of said elastic layer permits expansion of the wall surfaces of the socket opening therein to receive said prong-like member tightly and maintains the circuit means within said socket in firm contact with said member.

5. The composite circuit panel board set forth in claim 4 further characterized by circuit means being positioned between both of said rigid layers and said elastic layer.

6. In a printed circuit board, a base panel of elastic insulating material having a plurality of holes for receiving the leads of electrical components carried on the board, printed circuitry on one side of the panel, said circuitry having integral extensions providing linings on the sidewalls of said holes, said linings having a plurality of longitudinal slits to avoid interference with the elastic compression of the adjacent panel material, the relaxed diameter of said holes being smaller than the diameter of said leads respectively so that an inserted lead radially enlarges the hole with the adjacent panel material constrictively embracing and urging the lining into contact with the lead for mechanical and electrical engagement therewith, and rigid means cooperable with said base panel for closely limiting movement of said leads transverse to the hole axes and for supporting said adjacent panel material to reduce the rate of plastic creep.

References Cited in the file of this patent

UNITED STATES PATENTS

| | | |
|---|---|---|
| 2,024,547 | Strongson | Dec. 17, 1935 |
| 2,229,377 | Friang | Jan. 21, 1941 |
| 2,322,388 | Powledge | June 22, 1943 |
| 2,433,384 | McLarn | Dec. 30, 1947 |
| 2,613,252 | Heibel | Oct. 7, 1952 |
| 2,683,839 | Beck | July 13, 1954 |

FOREIGN PATENTS

| | | |
|---|---|---|
| 1,063,811 | France | Dec. 23, 1953 |